(12) United States Patent
Mistry et al.

(10) Patent No.: US 6,352,913 B1
(45) Date of Patent: Mar. 5, 2002

(54) DAMASCENE PROCESS FOR MOSFET FABRICATION

(75) Inventors: Kaizad Rumy Mistry, Acton; Lawrence Allen Bair, Littleton, both of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/286,185

(22) Filed: Apr. 5, 1999

Related U.S. Application Data

(62) Division of application No. 09/067,896, filed on Apr. 28, 1998, now abandoned.

(51) Int. Cl.[7] ............... H01L 21/8238; H01L 21/3205; H01L 21/4763
(52) U.S. Cl. ............ 438/587; 438/199; 438/259; 438/585; 438/633; 438/639
(58) Field of Search ............... 438/259, 270, 438/589, 671, 633, 183, 197, 430, 585, 586, 587, 199, 275, 591, 637, 639

(56) References Cited

U.S. PATENT DOCUMENTS

| | | | |
|---|---|---|---|
| 5,210,437 A | 5/1993 | Sawada et al. | 257/392 |
| 5,218,232 A | 6/1993 | Yuzurihara et al. | 257/754 |
| 5,316,974 A | 5/1994 | Crank | 438/643 |
| 5,434,093 A * | 7/1995 | Chau et al. | 437/41 |
| 5,600,168 A * | 2/1997 | Lee | 257/336 |
| 5,625,217 A | 4/1997 | Chau et al. | 257/412 |
| 5,650,341 A | 7/1997 | Yang et al. | 438/217 |
| 5,786,256 A * | 7/1998 | Gardner et al. | 438/305 |
| 5,937,303 A * | 8/1999 | Gardner et al. | 438/305 |
| 5,858,843 A * | 12/1999 | Doyle et al. | 438/299 |
| 5,998,288 A * | 12/1999 | Gardner et al. | 438/589 |
| 6,015,746 A * | 1/2000 | Yeh et al. | 438/421 |
| 6,211,025 B1 * | 4/2001 | Gardner et al. | 438/300 |

OTHER PUBLICATIONS

Akasaka et al., "Low–Resistivity Poly–Metal Gate Electrode Durable for High–Temperature Processing," *IEEE Transactions on Electron Devices*, vol. 43, No. 11, Nov. 1996, pp. 1864–1869.

No author, "Potential Device Applications, " *RCA Review*, Dec. 1970, pp. 740.

* cited by examiner

*Primary Examiner*—Charles Bowers
*Assistant Examiner*—Thanhha Pham
(74) *Attorney, Agent, or Firm*—Sharp, Comfort & Merrett, P.C.

(57) ABSTRACT

An improved MOSFET transistor is disclosed having a high dielectric constant gate dielectric and a metal gate electrode. With such a procedure, the known problems with polysilicon gate electrodes on very thin gate oxide transistors are greatly improved, resulting in improved gate threshold voltage control and improved transistor electrical properties, without loss of the benefit of self aligned source and drain electrodes available with polysilicon gates. Dual metal gate electrodes are also disclosed and exhibit improved CMOS transistor function compared to polysilicon gates, resulting in better and more controlled transistor properties. Thus the metal Damascene gate process results in faster and more consistent MOS and CMOS transistors and improved IC fabrication.

24 Claims, 2 Drawing Sheets

DAMASCENE PROCESS FOR MOSFET FABRICATION

This is a divisional of Ser. No. 09/067,896, filed Apr. 28, 1998 now abandoned.

BACKGROUND OF THE INVENTION

This invention relates generally to the fabrication of Metal Oxide Semiconductor Field Effect Transistors (MOSFET) integrated circuits (ICs), and more particularly to the fabrication of ICs having very thin gate dielectric layers with high dielectric constant and with metal gate electrodes.

As is known in the art, complex high speed IC circuits require very thin gate dielectric layers, and as close to zero gate electrode resistance as practical in order to provide fast low cost circuit operation. As is also well known in the art, there exists a problem with unwanted depletion of even heavily doped polysilicon gate electrodes which results in an effective increase in the thickness of thin gate oxide layers. This problem results in poor control over transistor turn-off voltage levels at short channel lengths, i.e., what is known as the short channel effect. For transistors with relatively thick gate oxides, this poly depletion effect is not significant, but with MOS gate oxides approaching 2.5 nm, the effect unacceptably reduces transistor performance.

It is well known that the use of a metal as the gate electrode eliminates the poly depletion problem and the resulting undesirable changes in the threshold voltage. It is also known that the use of polysilicon has an advantage over the use of metal for gate electrodes due to the ability to differently dope the polysilicon for different work functions in the two parts of a CMOS gate. Thus two different metals (i.e., with two different work functions) could be required for efficient CMOS devices. Two different metal gates raises the possibility that the two different types of transistors would have a systematic and unpredictable variation in what is known as the gate length, and hence unpredictable transistor performance.

Another problem in the art is that as the gate oxide becomes thinner to improve transistor performance, the thinner gate can not prevent gate electrode current from tunneling into the channel region. It would solve a known problem in the art to provide a gate dielectric that has a very low effective electrical capacitive thickness for high transistor performance, but also has low tunneling current. Many such "high k" materials are under investigation, such as Silicon Nitride (Si3N4), Barium Strontium Titanate (BST), Titanium Dioxide (TiO2), and Tantalum Pentoxide (Ta2O5), but problems exist in processing polygate IC devices with these dielectrics because of what are known as etch selectivity issues during the wet chemical, plasma, and reactive ion etches commonly used in the art.

Another problem in the art is to minimize the parasitic transistor capacitance, which slows the transistor down. A known method to reduce parasitic junction capacitance is to restrict the channel dopant region to minimize the overlap to the source/drain (S/D) region by use of a masked implant. This process is restricted by the alignment tolerances, and a self aligned process would solve this problem.

Thus a problem exists in the art of polysilicon gate material depleting under the influence of the gate voltage and effectively increasing the gate oxide thickness and decreasing the transistor performance. There also exists a problem with gate electrode to channel tunneling leakage with thin gate oxide thickness and the associated etch selectivity problems. Finally, there exists a problem of minimizing transistor parasitic capacitance.

SUMMARY OF THE INVENTION

In accordance with the invention, an improved thin gate oxide transistor is made by depositing and patterning first and second dielectric layers on a semiconductor substrate to define and open gate regions, depositing or growing a silicon dioxide or high dielectric constant gate dielectric layer and depositing a gate polysilicon or metal layer. Removing the polysilicon/metal and gate dielectric layer in non gate regions by use of chemical-mechanical polishing (CMP), and stripping the remaining parts of the first and second dielectric layers. Ion implanting a S/D extension region, depositing and patterning a spacer dielectric, and ion implanting source and drain regions completes the transistor. With such a procedure, the etch selectivity problems are resolved, the poly depletion is greatly reduced and the gate dielectric layer may be made thicker, with reduced tunneling and parasitic capacitance.

In another embodiment a CMOS device is provided using a masking layer after the defining of the gate regions to protect P channel regions while forming N channel gates, and a second masking layer to protect the N channel regions while the P channel gates are formed.

In yet another embodiment, a CMOS device is provided using a self aligned threshold voltage implant into the open gate regions defined by patterning the first and second dielectric layers, thereby reducing transistor parasitic capacitances and improving performance.

BRIEF DESCRIPTION OF THE DRAWINGS

The foregoing features of this invention, as well as the invention itself, may be more fully understood from the detailed description read together with the accompanying drawings, in which.

DESCRIPTION OF THE PREFERRED EMBODIMENTS

Figure 1:
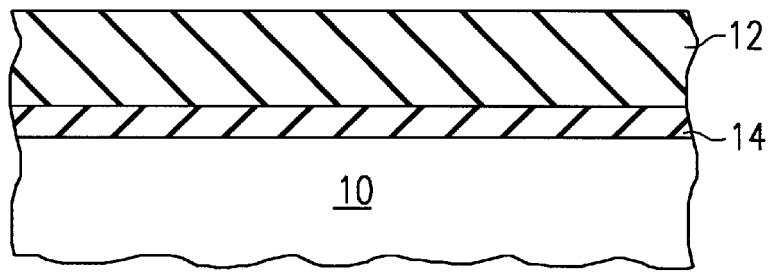
FIG. 1 is a cross section of a substrate in accordance with the invention.

Referring now to FIG. 1, a semiconductor substrate 10, preferably silicon, has a dielectric layer 12 on at least the front surface. This dielectric layer, known as a Damascene layer, is chosen to have a preferential etch rate over the semiconductor substrate, such that the substrate will act as what is known as an etch stop during the etch portion of the patterning process. Dielectric layer 12, preferably silicon dioxide, is also chosen to have a preferential etch rate over the preferred patterning material, photoresist.

An alternative embodiment includes a second dielectric layer 14 placed between dielectric 12 and the substrate 10 to increase the choices of possible dielectric layers and improve the etch ratios between the dielectric layers and the photoresist and substrate layers. A preferred embodiment uses silicon nitride for the first dielectric 12 for a high etch ratio over photoresist and layer 14, and silicon dioxide for the second layer 14 for a high etch ratio over silicon.

Figure 2:
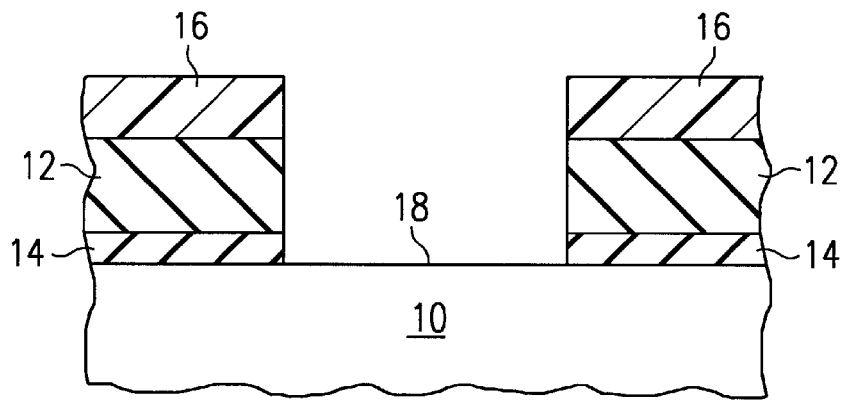
FIG. 2 is a cross section of a gate region definition in accordance with the invention.

Referring now to FIG. 2, a patterning layer 16 is deposited over the dielectric layer. A preferred patterning layer is photoresist. The pattern is predetermined to expose the regions of the substrate that will become the gate electrode region 18 of the transistor. The photoresist and dielectric are exposed, developed, baked and etched according to any of the processes well known in the art.

In an alternative embodiment, it is possible to include what is known as a threshold adjust ion implantation into the opened gate regions at this stage. A benefit of this arrangement is that the ion implantation is fully self aligned with the gate regions and thereby reduces parasitic transistor junction capacitance.

Figure 3:
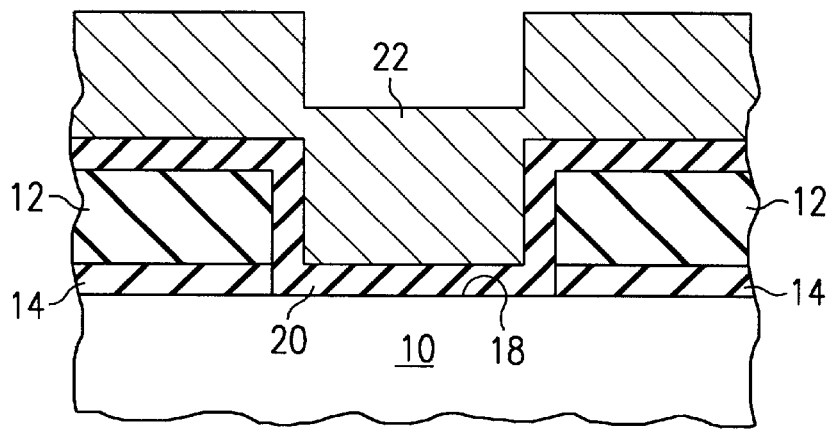
FIG. 3 is a cross section of gate dielectric and metal layer.

Referring now to FIG. 3, a gate dielectric layer 20 and a gate metal layer 22 are deposited or grown on the Damascene layer 12, or alternatively, layers 12 and 14. The gate dielectric layer 20 is preferably silicon dioxide or a high dielectric constant material, such as tantalum pentoxide, barium strontium titanate or titanium dioxide. The metal 22 is any metallic material such as doped polycrystalline silicon, but preferably is a refractory material such as tungsten, tungsten nitride, titanium nitride, or a silicide material such as tungsten silicide. Gate dielectric layer 20 thickness is selected for desired transistor threshold voltage and electrical characteristics. The thickness of the gate metal layer 22 is chosen to have the desired electrical conductivity, as well as to completely fill the trench previously etched in dielectric layers 12 and 14.

Figure 4:
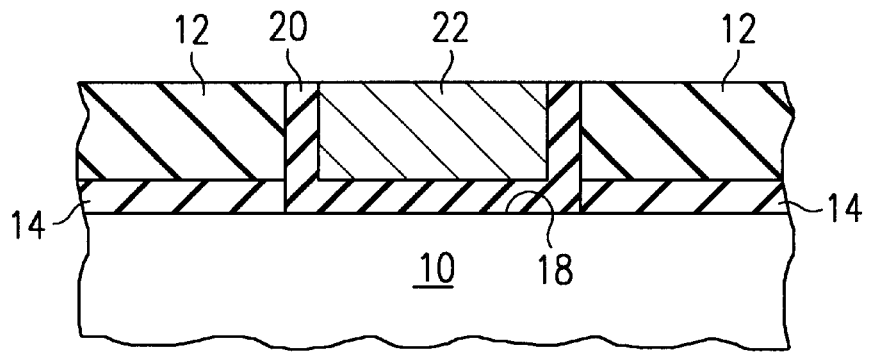
FIG. 4 is a cross section of a metal gate and dielectric.

Referring now to FIG. 4, the portion of the gate dielectric and metal that is not over the gate region 18, is removed, preferably by means of what is known as chemical mechanical polishing (CMP). CMP removes the gate metal and dielectric until the Damascene layer, dielectric 12, is exposed.

Figure 5:
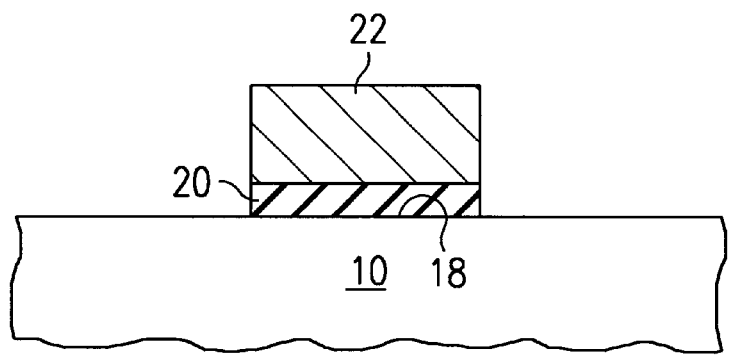
FIG. 5 is a cross section of a finished gate in accordance with the invention.

Referring now to FIG. 5, the remaining Damascene dielectric 12 and 14 is stripped, and the portion of the gate dielectric 20 that is not protected by the gate metal 22 is removed by any of the methods well known in the art. In this fashion, the gate electrode is formed over the gate region 18.

Figure 6:
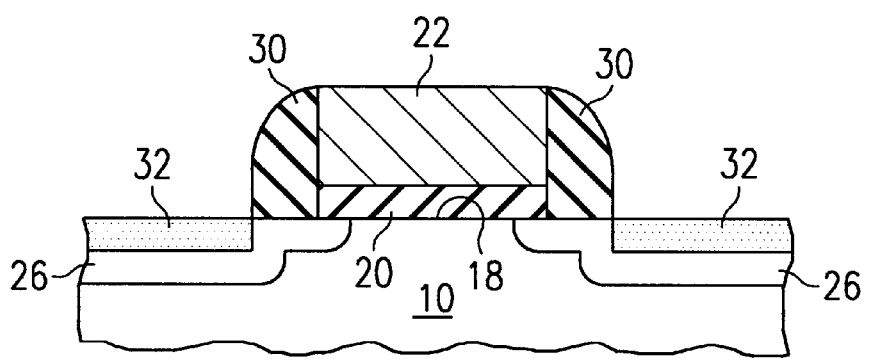
FIG. 6 is a cross section of a transistor in accordance with the invention.

Referring now to FIG. 6, a lightly doped source and drain region 26 is formed, preferably by ion implantation, using the gate metal 22 as the patterning mask. Spacers 30 are then deposited by any of the methods well known in the art, preferably by deposition of a spacer dielectric and reactive ion etch. Heavily doped source and drain regions 32 are formed, preferably by ion implantation, using the metal gate 22 and the spacers 30 as the patterning mask. The source drain regions 32 may also be silicided to further reduce the electrical resistance of the region. In this fashion, a MOS transistor having a self aligned metal gate and a high dielectric constant gate material may be provided.

In an alternative embodiment, a complementary MOS transistor device (i.e., CMOS) may be provided by defining both P type and N type gate regions as described above, and depositing a masking layer, preferably polysilicon, to protect either the P channel or the N channel regions while the transistors in opposite type region are fabricated. The masking layer is then stripped off, and a second masking layer, preferably polysilicon, is deposited and patterned to protect the opposite region.

A benefit of the present arrangement is that the metal gate electrodes do not have the problem of poly depletion and the consequent short channel effect problem. Thus the transistor threshold voltage is lower and more controlled, resulting in faster and more efficient devices. Another benefit of the present arrangement is the transistors have matched gate lengths and lower electrical resistance, and thus higher performance as compared to polysilicon gates.

Another benefit of the present arrangement is that the gate dielectric may be comprised of a material that has a higher dielectric constant than the silicon dioxide commonly used in the art, resulting in improved gate capacitance for a given gate dielectric thickness, and thus faster switching rates and transistor operation. The thicker physical gate dielectric possible because of the use of higher constant material may greatly decrease the parasitic tunneling current that exists between the gate electrode and the channel regions in thin gate oxide transistors.

Thus, by use of the present arrangement, a thin gate transistor with better threshold control and accuracy, and with superior performance may be made at low cost, while the potential problems of etch selectivity are resolved.

Having described a preferred embodiment of the invention, it will now be apparent to those skilled in the art that other embodiments incorporating its concept may be provided. It is felt therefore, that this invention should not be limited to the disclosed embodiment, but should be limited only by the spirit and scope of the appended claims.

What is claimed is:

1. A method for fabricating an integrated circuit, the method comprising:

forming a first dielectric layer over a first surface of a semiconductor region;

etching through the thickness of a part of said first dielectric layer, said semiconductor region acting as an etch stop whereby said etched-through first dielectric layer bounds a limited area of said semiconductor region at but not extending into said first surface;

forming a second dielectric layer upon said first dielectric layer, said second dielectric layer covering said first surface;

forming a conductive layer upon said second dielectric layer;

removing said conductive layer and said second dielectric layer in all areas of said first surface except over said limited area; and removing remaining portions of said first dielectric layer, leaving said conductive layer and said second dielectric layer over said limited area of said semiconductor region.

2. The method of claim 1 wherein said second dielectric layer has a dielectric constant greater than a dielectric constant of silicon dioxide.

3. The method of claim 1 wherein said first dielectric layer is comprised of silicon dioxide.

4. The method of claim 1 wherein said conductive layer is comprised of doped polycrystalline silicon.

5. The method of claim 1 wherein said etching through the thickness of said first dielectric layer is effected by photoresist patterning and plasma etching.

6. The method of claim 1 wherein the conductive layer and the second dielectric layer are removed by a chemical-mechanical polish.

7. The method of claim 1 wherein the conductive layer comprises a layer of refractory metal.

8. The method of claim 2 wherein the second dielectric layer is selected from the group consisting of tantalum pentoxide, barium strontium titanate, and titanium dioxide.

9. A method for fabricating an integrated circuit, the method comprising:

forming a first dielectric layer over a first surface of a semiconductor region;

forming a second dielectric layer upon said first dielectric layer;

etching through the thicknesses of a region of said second dielectric layer and an aligned region of said first dielectric layer, said semiconductor region functioning as an etch stop, to define at least one exposed area of said semiconductor region at but not extending into said first surface, said exposed area defined by the etched-through regions of said first and second dielectric layers;

forming a third dielectric layer over said first surface to form a dielectric over said exposed area;

forming a conductive layer over said third dielectric layer;

removing portions of said conductive layer and said third dielectric layer in regions above remaining portions of said first and second dielectric layers, the removing leaving a portion of the conductive layer and the third dielectric over said exposed area.

10. The method of claim 9 wherein said third dielectric has a dielectric constant greater than that of silicon dioxide.

11. The method of claim 10 wherein said first dielectric layer is comprised of silicon dioxide and said second dielectric layer is comprised of silicon nitride.

12. The method of claim 9 wherein the portions of said conductive layer and said third dielectric layer are removed by a chemical-mechanical polish.

13. The method of claim 9 wherein the conductive layer comprises a layer of refractory metal.

14. A method of forming a MOS transistor, the method comprising:

forming a sacrificial dielectric layer over a first surface of a semiconductor region;

etching through the thickness of a portion of the sacrificial layer over part of said first surface of the semiconductor region, said part of said first surface acting as an etch stop to expose a gate region area at but not extending into said first surface;

forming a gate dielectric over a remaining portion of the sacrificial layer and over said gate region area;

forming a conductive layer over the gate dielectric;

performing a chemical-mechanical polish to remove portions of the gate dielectric and the conductive layer from over the remaining portion of the sacrificial layer, thereby defining a gate electrode and an underlying gate dielectric layer over said gate region;

removing the remaining portion of the sacrificial layer;

subsequently forming source and drain regions in the semiconductor region adjacent said gate region area using said gate electrode as a self-alignment mask.

15. The method of claim 14 wherein the sacrificial layer comprises an oxide layer.

16. The method of claim 15 wherein the sacrificial layer comprises an oxide layer and a nitride layer.

17. The method of claim 14 wherein the gate dielectric comprises a silicon oxide.

18. The method of claim 14 wherein the gate dielectric comprises a dielectric with a dielectric constant greater than that of silicon dioxide.

19. The method of claim 18 wherein the gate dielectric is selected from the group consisting of tantalum pentoxide, barium strontium titanate, and titanium dioxide.

20. The method of claim 14 wherein the conductive layer comprises a polysilicon layer.

21. The method of claim 14 wherein the conductive layer comprises a refractory metal layer.

22. The method of claim 21 wherein the conductive layer comprises a refractory metal silicide layer.

23. The method of claim 14 and further comprising:

forming said source and drain regions as lightly doped source and drain regions forming sidewall insulators along sidewalls of the gate electrode; and forming heavily doped source and drain regions in the semiconductor region at said first surface adjacent the sidewall insulators.

24. A method of forming a MOS transistor, the method comprising:

forming a sacrificial dielectric layer over a first surface of a semiconductor region;

etching through the thickness of a portion of the sacrificial layer over part of said first surface of the semiconductor region, said part of said first surface acting as an etch stop to expose a gate region area at but not extending into said first surface;

forming a gate dielectric over a remaining portion of the sacrificial layer and over said gate region area, said gate dielectric having a dielectric constant greater than that of silicon dioxide;

forming a refractory metal or refractory metal silicide conductive layer over the gate dielectric;

performing a chemical-mechanical polish to remove portions of the gate dielectric and the conductive layer from over the remaining portion of the sacrificial layer, thereby defining a gate electrode and an underlying gate dielectric layer over said gate region area;

removing the remaining portion of the sacrificial layer;

subsequently ion implanting lightly doped source and drain regions in the semiconductor region adjacent to sides of said gate region area using said gate electrode as a self-alignment mask;

forming sidewall insulators along sidewalls of the gate electrode; and ion implanting more heavily doped regions in the lightly doped source and drain regions, using said sidewall insulators as an implant mask.

* * * * *